United States Patent
Ishikawa et al.

(10) Patent No.: US 7,705,236 B2
(45) Date of Patent: Apr. 27, 2010

(54) ELECTRODE MATERIAL, SOLAR CELL, AND METHOD FOR PRODUCING SOLAR CELL

(75) Inventors: Naoki Ishikawa, Gunma (JP); Satoyuki Ojima, Gunma (JP); Hiroyuki Ohtsuka, Gunma (JP); Haruhiko Kano, Kyoto (JP); Masanobu Yano, Kyoto (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 576 days.

(21) Appl. No.: 11/631,480

(22) PCT Filed: Jun. 15, 2005

(86) PCT No.: PCT/JP2005/010931

§ 371 (c)(1),
(2), (4) Date: Jan. 4, 2007

(87) PCT Pub. No.: WO2006/008896

PCT Pub. Date: Jan. 26, 2006

(65) Prior Publication Data

US 2007/0215203 A1   Sep. 20, 2007

(30) Foreign Application Priority Data

Jul. 16, 2004   (JP) ............................. 2004-210213

(51) Int. Cl.
   *H01L 31/00* (2006.01)
(52) U.S. Cl. .................... 136/256; 252/514; 106/1.19
(58) Field of Classification Search ............... 136/243, 136/258, 260, 264, 263; 257/292, 293; 252/514; 106/1.19
See application file for complete search history.

(56) References Cited

U.S. PATENT DOCUMENTS 4,767,663 A * 8/1988 Shimizu et al. .......... 428/32.79

(Continued)

FOREIGN PATENT DOCUMENTS

JP   A 8-37318   2/1996

(Continued)

OTHER PUBLICATIONS

Hoornstra J et al. The importance of paste rheology in improving fine line, thick film screen printing of front side metallization, 1997, Internet Publication.*

(Continued)

*Primary Examiner*—Jeffrey T Barton
*Assistant Examiner*—Devina Pillay
(74) *Attorney, Agent, or Firm*—Oliff & Berridge, PLC

(57) ABSTRACT

The present invention is an electrode material comprising at least, a silver powder, a glass frit, and an organic vehicle, wherein a rate of Ag content of the electrode material is 75 wt % to 95 wt %, and a ratio of contents of Ag grains having an average grain diameter of 0.5 µm to 3 µm and Ag grains having an average grain diameter of 4 µm to 8 µm in the electrode material is (the Ag grains having an average grain diameter of 0.5 µm to 3 µm):(the Ag grains having an average grain diameter of 4 µm to 8 µm)=20-80 wt %:80-20 wt %, and a solar cell comprising an electrode formed by using the electrode material. Thereby, an electrode material that can be stably filled in an electrode groove formed on a semiconductor device and that an electrode with narrow line width and small resistance loss can be easily formed by, and a solar cell with high power having an electrode formed by using the electrode material are provided.

10 Claims, 2 Drawing Sheets

U.S. PATENT DOCUMENTS 5,618,470 A * 4/1997 Yamana ............... 252/512
5,661,041 A * 8/1997 Kano .................... 438/72
6,051,448 A * 4/2000 Hayama et al. ........ 438/108

FOREIGN PATENT DOCUMENTS

| JP | A 8-191152 | 7/1996 |
|----|------------|--------|
| JP | A 2001-223372 | 8/2001 |
| JP | A 2003-133567 | 5/2003 |
| JP | A 2003-257243 | 9/2003 |

OTHER PUBLICATIONS

Material Science and Data Sheet Alpha Terpineol MSDS.*
Mamunya Y. et al. "Influnence of pressure on the electrical conductivity of metal powders used as filler in polymer composites" Powder Technology 140 (2004) 49-55.*
W. Jooss et al., "Buried Contact Solar Cells on Multicrystalline Silicon With Optimised Bulk and Surface Passivation," $3^{rd}$ World Conference on Photovoltaic Energy Conversion, May 11-18, 2003, Osaka, Japan.

* cited by examiner (A)

(B)

(C)

(D)

ELECTRODE MATERIAL, SOLAR CELL, AND METHOD FOR PRODUCING SOLAR CELL

TECHNICAL FIELD

The present invention relates to an electrode material containing a silver powder, a semiconductor device such as a solar cell of which electrode is formed by using the electrode material, and a method for producing a solar cell.

BACKGROUND ART

For a semiconductor device in which an electrode is formed such as a solar cell, it is necessary to form an electrode with low resistance having a narrow occupied area on a light acceptance surface so as not to block light. Therefore, for the purpose of enlargement of electrode cross-section area with controlling the electrode width to a certain size, a solar cell or the like has been produced by forming a predetermined electrode groove on a substrate surface and then forming a buried electrode inside the groove. As examples thereof, buried-type electrode solar cells (buried-contact-type solar cells) have been developed and disclosed, for example, in Japanese Patent Application Laid-open (kokai) No. H08-37318 and No. H08-191152, and the like.

In the case of forming a finger electrode on a front surface of a solar cell, for example, a finger electrode formed by a screen printing method generally has approximately a width of 120 μm and a height of 15 μm. However, in the case of forming a buried-type electrode inside a groove as the above-described invention, a finger electrode having approximately a width of 30 μm and a depth of 60 μm can be formed by combining a plating method.

By forming a buried-type electrode (finger electrode) as described above, a solar cell with narrow electrode width and an electrode cross-section area being nearly equal to that of an electrode formed by a screen printing method can be produced. Thereby, without increasing resistance loss in the finger electrode portion, finger shadow loss is drastically reduced and the light acceptance area can be enlarged. Therefore, it becomes possible that the solar cell power is enhanced.

However, in the formation of a buried-type electrode by using a plating method as described above, in order to maintain the electrode formation condition to be constant, namely, in order to maintain a precipitation rate or a film composition to be constant, it is necessary that bath components such as a metal salt concentration of the electrode and a reducing agent concentration thereof are strictly analyzed and administered with pH and temperature, and it has been difficult to stably form an electrode having a desired quality. Moreover, in the case of using an electroless plating method, electrode forming cost is reduced. However, there has been a crucial disadvantage that formation of a predetermined cross-section area requires time and that productivity is very low. Furthermore, abnormal precipitation is easily caused against a minor defect on the device surface. Therefore, it is also difficult to pursue a beautiful physical appearance thereof.

With respect to such disadvantages, in Proceedings of 3rd World Conference on Photovoltaic Conversion, "Buried Contact Solar Cells on Multicrystalline Silicon with Optimized Bulk and Surface Passivation" or Japanese Patent Application Laid-open (kokai) No. 2001-223372, inventions for forming an electrode with the narrow electrode width by burying the electrode in a electrode groove by a screen printing method have been disclosed. However, for example, as the Japanese Patent Application Laid-open (kokai) No. 2001-223372 or the like, when a groove having a width of approximately 100 μm is formed on a semiconductor substrate and then an electrode material (electrode paste) for a solar cell which is generally used by a screen printing method is pressed into the groove, a binder component contained in the electrode material is burnt out in firing the electrode material, and the electrode material is constricted by sintering of silver grains. Thereby, there has been a problem that the electrode material is not sufficiently filled in the groove and simultaneously delamination of the electrode material is caused in the groove and the contact area to the semiconductor substrate is reduced. Furthermore, there has also been caused problems that a vacancy taken in the groove with the electrode material in the printing expands at a burst in the firing, or decomposition gas in the time of the burning-out loses vents and expands in the groove, and therefore, the electrode in the groove is partially broken. Such problems have increased series resistance of the solar cell and consequently have caused degradation of the power of the solar cell.

Moreover, in pressing the electrode material into the groove, it is devised to lower viscosity of the electrode material to be approximately 40-100 Pa·s and thereby the electrode material is made to easily flow in the groove. However, in this case, the electrode material leaks out of the groove and generates blur (seeping-out). If blur is generated in the electrode formation as described above, the electrode width of the finger electrode widens. Therefore, a problem that shadow loss is increased to degrade the solar cell power is caused. On the other hand, if a squeegee speed in the screen printing is simply enhanced in order to reduce the blur of the electrode, there has been a problem that patchiness is generated in the electrode in the groove and accordingly the finger electrode becomes easily broken and the solar cell power is degraded.

DISCLOSURE OF THE INVENTION

Accordingly, the present invention has been conceived in view of the above problems. An object of the present invention is to provide an electrode material that can be stably filled in an electrode groove formed on a semiconductor substrate and that an electrode with narrow line width and small resistance loss can be easily formed by, a solar cell with high power having an electrode formed by using the electrode material, and a method for producing the solar cell.

In order to accomplish the above object, according to the present invention, there is provided an electrode material comprising at least, a silver powder, a glass frit, and an organic vehicle, wherein a rate of Ag content of the electrode material is 75 wt % to 95 wt %, and a ratio of contents of Ag grains having an average grain diameter of 0.5 μm to 3 μm and Ag grains having an average grain diameter of 4 μm to 8 μm in the electrode material is (the Ag grains having an average grain diameter of 0.5 μm to 3 μm):(the Ag grains having an average grain diameter of 4 μm to 8 μm)=20-80 wt %:80-20 wt %.

In addition, an average grain diameter represents an SEM grain diameter that is an average value calculated by measuring diameters of grains based on an SEM photograph.

When a rate of Ag content of the electrode material is 75 wt % to 95 wt %, and a ratio of contents of Ag grains having an average grain diameter of 0.5 μm to 3 μm and Ag grains having an average grain diameter of 4 μm to 8 μm in the electrode material is (the Ag grains having an average grain diameter of 0.5 μm to 3 μm):(the Ag grains having an average grain diameter of 4 μm to 8 μm)=20-80 wt %:80-20 wt % as described above, the electrode material can be stably filled in the electrode groove formed on a semiconductor substrate.

Therefore, there can be provided an electrode material by which the electrode having narrow line width can be easily formed and no gap is generated between the electrode and the substrate, and the electrode with small resistance loss can be stably formed by preventing delamination or breaking of the electrode in the groove.

In the above case, it is preferable that a viscosity of the electrode material is 150 Pa·s to 400 Pa·s.

When a viscosity of the electrode material is 150 Pa·s to 400 Pa·s, in filling the electrode material in the electrode groove, generation of blur by seeping-out of the electrode material from the groove or generation of patchiness in the groove can be prevented. In addition, a viscosity in the present invention represents a viscosity measured at 25° C. by a Brookfield rotational viscometer (for example, HB-type SSA 15/6R).

Moreover, it is preferable that a thixotropy (TI value) in 5 rpm/50 rpm of the electrode material is 0.5 to 2.5, or a thixotropy (TI value) in 5 rpm/20 rpm thereof is 0.5 to 2.0.

When a thixotropy in 5 rpm/50 rpm of the electrode material or a thixotropy in 5 rpm/20 rpm thereof is the predetermined value as described above, generation of blur or patchiness in the electrode formation can be more prevented by the electrode material. In addition, in the present invention, a thixotropy in 5 rpm/50 rpm represents a radio of a viscosity in 5 rpm and a viscosity in 50 rpm measured by the rotational viscometer, and a thixotropy in 5 rpm/20 rpm represents a radio of a viscosity in 5 rpm and a viscosity in 20 rpm measured by the rotational viscometer.

Furthermore, it is preferable that a decomposition initiation temperature of the organic vehicle is 170° C. to 250° C.

When a decomposition initiation temperature of the organic vehicle is 170° C. to 250° C. as described above, resolvability of the organic vehicle in the electrode formation can be enhanced. Therefore, breaking of the electrode due to decomposition gas of the organic vehicle can be certainly prevented in firing the electrode material. Therefore, an electrode with very small resistance loss can be stably formed.

In addition, a decomposition initiation temperature represents a temperature when a TG curve shifts to decrease following solvent volatilization in a thermogravimetric analysis (TG).

Moreover, according to the present invention, there can be provided a semiconductor device comprising an electrode formed by using the electrode material according to the above-described present invention, and particularly, the semiconductor device can be a solar cell functioning as a photovoltaic device.

In such a semiconductor device comprising an electrode formed by using the electrode material of the present invention, the line width in the electrode is narrow, and also such problems as breaking due to decomposition gas and delamination due to constriction of the electrode material in firing are not caused in the electrode, and generation of blur or patchiness is prevented, and furthermore, it can be a high-quality semiconductor device in which an electrode having low electrode resistivity is formed. In particular, a solar cell in which such a semiconductor device of the present invention functions as a photovoltaic device has narrow line width of the electrode and small resistance loss thereof, and therefore it can be a high-quality solar cell by which high power can be obtained.

Furthermore, according to the present invention, there can be provided a solar cell constituted by forming at least, a pn junction, a front surface electrode, and a back surface electrode, wherein the front surface electrode is formed by using the electrode material according to the present invention.

In such a solar cell having a front surface electrode formed by using the electrode material of the present invention, the line width in the electrode is narrow, and also such problems as breaking due to decomposition gas and delamination due to constriction of the electrode material in firing are not caused in the electrode, and generation of blur and patchiness is prevented, and the resistance loss is small, and therefore it can be a high-quality solar cell by which high power can be obtained.

Moreover, the present invention provides a method for producing a solar cell, comprising, at least, a step of forming an impurity layer having a second conductivity type different from a first conductivity type on a front surface of a silicon substrate having the first conductivity type, a step of forming an antireflection film on the impurity layer having the second conductivity type, a step of forming an electrode groove on the silicon substrate, and a step of forming an electrode in the electrode groove formed on the silicon substrate by using the electrode material according to the present invention.

By producing a solar cell as described above, an electrode with narrow line width which is filled completely in the electrode groove can be easily formed without causing delamination or breaking thereof and with preventing generation of blur and patchiness. Therefore, a high-quality solar cell that the electrode resistance loss is reduced of and that high power can be obtained by can be stably produced.

In the above case, it is preferable that the step of forming an electrode is performed by a screen printing method.

By performing the step of forming an electrode by a screen printing method as described above, a high-power solar cell can be produced with high productivity. Therefore, cost reduction of the solar cell can be accomplished.

As described above, according to the electrode material of the present invention, the electrode material can be stably filled in an electrode groove formed on a semiconductor substrate. Therefore, an electrode with narrow line width can be easily and stably formed with preventing delamination and breaking of the electrode in the groove. Thereby, it becomes possible that a high-power solar cell having an electrode with narrow line width and small resistance loss is stably produced by a screen printing method. Therefore, a high-quality solar cell can be provided at a low cost.

BEST MODE FOR CARRYING OUT THE INVENTION

Figure 1:
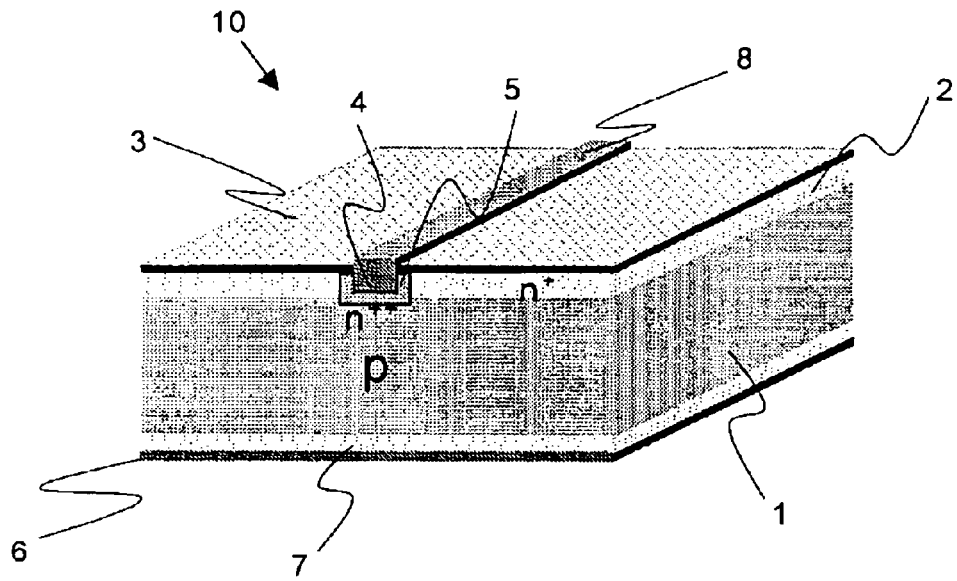
FIG. 1 is a schematic constitution view showing schematically a constitution of a solar cell according to the present invention.

Hereinafter, embodiments according to the present invention will be explained. The present invention is not limited thereto.

The present inventors has experimented and studied thoroughly in order to make it possible to stably form an electrode with narrow line width having small resistance loss as an electrode of a semiconductor device such as a solar cell. As a result, the present inventors have found that as a electrode material for forming an electrode, the electrode material in which a rate of Ag content is 75 wt % to 95 wt % and in which a ratio of contents of Ag grains having an average grain diameter of 0.5 μm to 3 μm and Ag grains having an average grain diameter of 4 μm to 8 μm is (the Ag grains having an average grain diameter of 0.5 μm to 3 μm):(the Ag grains having an average grain diameter of 4 μm to 8 μm)=20-80 wt %:80-20 wt % can be used therefor. And, the present invention has been accomplished.

First, the electrode material of the present invention is explained.

The electrode material of the present invention is an electrode material comprising at least, a silver powder, a glass frit, and an organic vehicle, wherein a rate of Ag content of the electrode material is 75 wt % to 95 wt %, and a ratio of contents of Ag grains having an average grain diameter of 0.5 μm to 3 μm and Ag grains having an average grain diameter of 4 μm to 8 μm in the electrode material is (the Ag grains having an average grain diameter of 0.5 μm to 3 μm):(the Ag grains having an average grain diameter of 4 μm to 8 μm)=20-80 wt %:80-20 wt %.

As explained specifically, the electrode material of the present invention contains a silver powder and a glass frit and an organic vehicle as main components, and a rate of Ag content in the electrode material is 75 wt % to 95 wt %. For example, if the rate of Ag content of the electrode material is less than 75 wt %, electrode resistivity becomes high in the case of forming the electrode and solar cell power becomes drastically degraded. On the other hand, if the rate of Ag content is more than 95 wt %, there is caused a problem that adhesiveness of the electrode and the semiconductor substrate is degraded or associativity of the electrode in itself is degraded and therefore it becomes easy to cause delamination or breaking of the electrode, or the like. However, when the rate of Ag content is in the above-described range of the present invention, it becomes possible that an electrode having low electrode resistivity can be stably formed without causing delamination or breaking.

Furthermore, in the electrode material of the present invention, two kinds of grains having different sizes of Ag grains having an average grain diameter of 0.5 μm to 3 μm and Ag grains having an average grain diameter of 4 μm to 8 μm is contained at a ratio of (the Ag grains having an average grain diameter of 0.5 μm to 3 μm):(the Ag grains having an average grain diameter of 4 μm to 8 μm)=20-80 wt %:80-20 wt %.

For example, if the average grain diameter or the content ratio of Ag grains is out of the above-described range, it becomes easy to cause reduction of contact area due to constriction of the electrode, delamination, breaking, increase of electrode resistivity, or the like. Therefore, it becomes difficult to form a solar cell having desired power. That is, in the case that grains having an average grain diameter of less than 0.5 μm are contained as the small Ag grains, the constriction of the electrode material is occasionally caused in forming the electrode to cause the reduction of contact area of the electrode or the delamination. On the other hand, if more than 3 μm, Ag grains cannot be densely filled in the groove, and breaking of the electrode becomes easy to be caused. Moreover, if grains having an average grain diameter of less than 4 μm are contained as the large grains, all the same, it becomes easy to cause the constriction of the electrode material and thereby to cause the reduction of contact area of the electrode or the delamination. On the other hand, if more than 8 μm, the electrode resistivity becomes large and it becomes easy to generate blur of the electrode. Furthermore, if the Ag grains having either of the average grain diameters are contained excessively over 80 wt %, the delamination is easy to be caused in forming the electrode and the contact area between the substrate and the electrode becomes small and the solar cell power becomes degraded.

Accordingly, when as the Ag grains, grains having an average grain diameter of 0.5 μm to 3 μm and having that of 4 μm to 8 μm are contained at the above-described ratio, the electrode material can be stably filled in the electrode groove formed on a semiconductor substrate, and the narrow electrode having a line width of, for example, approximately 30-100 μm can be easily formed. Moreover, without generating gap between the electrode and the substrate, delamination, breaking of the electrode in the groove can be prevented. Furthermore, generation of blur or patchiness is prevented, and therefore, it becomes possible to stably form an electrode having small resistance loss. In addition, for setting the above ratio of contents, for example, it is sufficient that two kinds of silver powders that respectively have the above-described predetermined average grain diameters are blended at the predetermined radio.

In addition, in the present invention, the glass frit and the organic vehicle contained in the electrode material is not particularly limited. For example, as the glass frit, borosilicate glass and such can be used. Moreover, as the organic vehicle, a vehicle in which resin having binder function is dissolved in an organic solvent can be used. For example, as the resin, ethyl cellulose resin or alkyd resin or the like can be used. As the organic solvent, terpineol, diethylene glycol monobutyl ether, diethylene glycol monobutyl ether acetate, or the like, can be used.

In the electrode material of the present invention as described above, it is preferable that a viscosity of the electrode material is 150 Pa·s to 400 Pa·s, for example, in a measurement at 25° C. by a Brookfield rotational viscometer (HB-type SSA 15/6R). Moreover, it is preferable that a thixotropy (TI value) in 5 rpm/50 rpm of the electrode material is 0.5 to 2.5, or a thixotropy (TI value) in 5 rpm/20 rpm thereof is 0.5 to 2.0. When the viscosity of the electrode material or particularly a thixotropy in 5 rpm/50 rpm or in 5 rpm/20 rpm of the electrode material has such a range as described above, generation of blur by seeping-out of the electrode material from the electrode groove in the case of forming the electrode or generation of patchiness can be effectively prevented.

According to the present invention, a semiconductor device having an electrode formed by using the above-described electrode material of the present invention. In particular, the semiconductor device can be a solar cell functioning as a photovoltaic device.

That is, the present invention can provide a solar cell in which at least a pn junction and a front surface electrode and a back surface electrode are formed, and in which the front surface electrode is formed by using the electrode material according to the present invention.

Hereinafter, a solar cell according to the present invention will be explained specifically with reference to drawings. Here, FIG. 1 is a schematic constitution view showing schematically a constitution of the solar cell according to the present invention.

In a solar cell 10 of the present invention, a pn junction is constituted by forming a low-concentration n-type impurity layer 2 (also referred to as emitter layer or diffusion layer) in which impurity such as phosphorus is diffused at a low concentration in a front surface side of a p-type silicon single crystal substrate 1, and further on the low-concentration n-type impurity layer 2, an antireflection film 3 is formed. As the antireflection film 3, for example, a silicon nitride film, a silicon oxide film, a titanium dioxide film, a zinc oxide film, a stannum oxide film, or the like, can be formed.

On the other hand, on the other surface (back surface) of the silicon substrate 1, a high-concentration p-type impurity layer 7 in which impurity such as boron is diffused at a high concentration is formed, and an Al electrode 6 is formed thereon as the back surface electrode.

Furthermore, on the substrate front surface side in which the above-described antireflection film 3 is formed, an electrode groove 4 is formed. A buried electrode (Ag electrode) 8 is provided on the electrode groove 4 as the front surface electrode. Moreover, a high-concentration n-type impurity layer 5 is formed in the periphery of the electrode groove 4.

In the present invention, in the solar cell 10 having such a structure, the above-described buried electrode 8 is formed by the above-described electrode material of the present invention. In such a solar cell having a buried electrode (front surface electrode) formed by using the electrode material of the present invention, the line width of the electrode can be narrow, for example, approximately 30-100 μm, and problems of breaking due to decomposition gas and delamination due to constriction in firing the electrode material are not caused in the electrode, and generation of blur or patchiness is prevented and resistance loss is small. Therefore, it can be a high-quality solar cell by which high power can be obtained.

Figure 2:
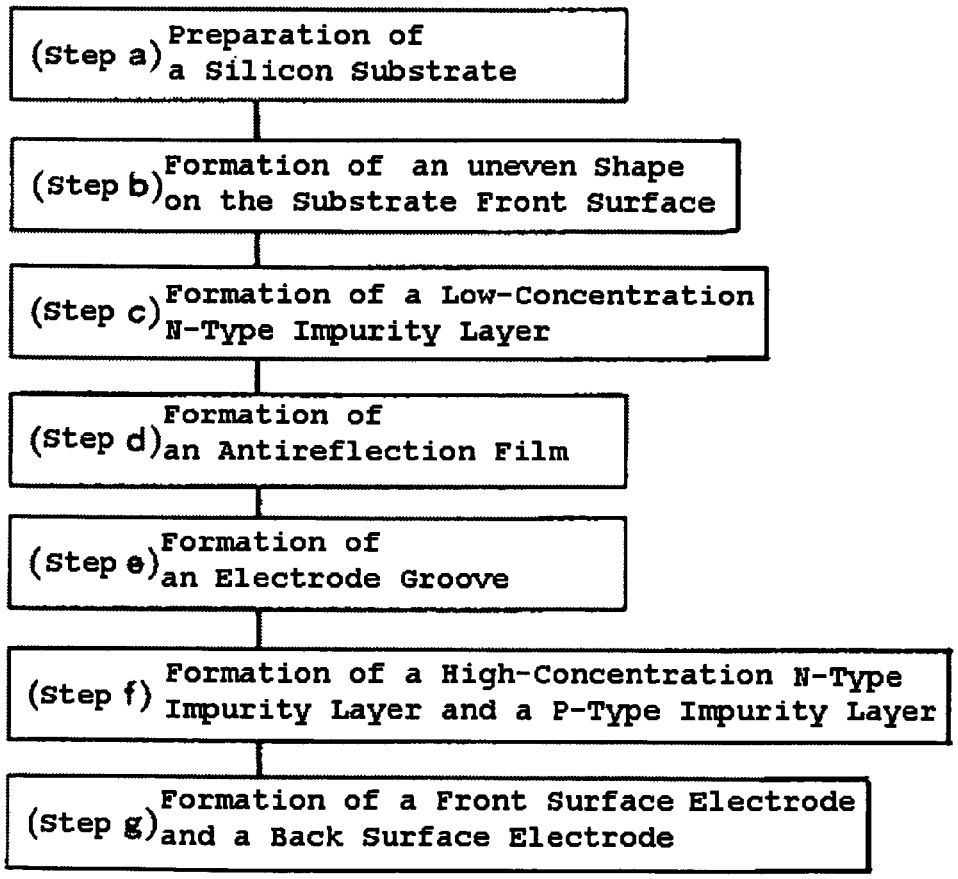
FIG. 2 is a flow chart showing an example of a method for producing a solar cell according to the present invention.

Next, a method for producing a solar cell according to the present invention will be explained with reference to FIG. 2. FIG. 2 is a flow chart showing an example of the method for producing a solar cell according to the present invention.

(Preparation of a Silicon Substrate: Step a)

First, as a silicon substrate having a first conductivity type, for example, a p-type silicon single crystal substrate having a crystal plane orientation of (100) doped with boron is prepared. A method for producing the p-type silicon single crystal substrate is not particularly limited. However, the p-type silicon single crystal substrate can be easily produced by, for example, growing a single crystal ingot doped with boron at a predetermined concentration by Czochralski method (CZ method) or by Floating zone method (FZ method) or the like, slicing the grown single crystal ingot into wafers, and then subjecting the wafer to a wafer-processing step such as an etching step being generally performed conventionally. In this case, it is preferable that a specific resistance of the prepared p-type silicon single crystal substrate is, for example, 0.1-20 Ω·cm. In particular, 0.5-2.0 Ω·cm is suitable for producing a high-performance solar cell.

(Formation of an Uneven Shape on the Substrate Front Surface: Step b)

Next, according to need, an uneven shape is formed on a front surface of the prepared p-type silicon single crystal substrate. The reason why an uneven shape is formed on the substrate front surface as described above is that it is necessary to make it possible to perform reflection at two times or more as much as possible on the light acceptance surface in order to reduce reflectance in the visible light region. As a method for forming the uneven shape on a wafer surface, for example, the prepared silicon single crystal substrate is immersed in an aqueous solution of a 3-wt % sodium hydroxide in which isopropyl alcohol is added, and wet-etched, and thereby, random texture surfaces can be formed on both sides of the substrate. Moreover, as other representative surface uneven structures, a V-shaped groove and a U-shaped groove can be exemplified. These can be formed by utilizing a grinding apparatus or the like. Moreover, for forming a random uneven shape on the substrate surface, acid etching, reactive ion etching, or the like, can also be used.

(Formation of a Low-Concentration N-Type Impurity Payer: Step c)

After forming the uneven shape on the substrate surface, a low-concentration n-type impurity layer (diffusion layer) to be an impurity layer having a second conductivity type different from a first conductivity type (p type) is formed on the wafer front surface. The low-concentration n-type impurity layer can be formed by, for example, using a liquid source of oxyphosphorus chloride and performing thermal diffusion at 820° C. Thereby, a n-type impurity layer having a sheet resistance of approximately 100Ω/□ is formed on the substrate front surface. In this case, a so-called back-to-back diffusion that is a diffusion method of superposing back surfaces and inserting the wafers into the same slot of a diffusion boat and performing diffusion can be utilized so that phosphorus does not diffuse in the substrate back surface as much as possible. In such a diffusion method, the diffusion dopant occasionally comes around from an edge of the substrate by approximately several millimeters. However, if pn separation is performed by plasma etching or laser, shunt can be prevented. Moreover, as other methods for forming a low-concentration n-type impurity layer, any one of, for example, a thermal diffusion method of utilizing a solid source, a coating diffusion method of using an oxyphosphorus chloride source, an ion implantation method of implanting phosphorus ions directly, and so forth, can be used.

(Formation of an Antireflection Film: Step d)

After forming the low-concentration n-type impurity layer, an antireflection film is formed on the impurity layer. For example, by using a LPCVD (Low Pressure Chemical Vapor Deposition: pressure reduction CVD) apparatus, the silicon single crystal substrate in which the low-concentration n-type impurity layer is formed is put in a furnace of the LPCVD apparatus, the in-furnace temperature is raised to 800° C. in a monosilane gas and a nitrogen atmosphere under a reduced pressure, and thereby, the antireflection film made of a silicon nitride film can be formed. In this case, it is preferable that the antireflection film is formed at a thickness of approximately 70-90 nm. Moreover, in this case, it is preferable that the refractive index of the antireflection film is in the vicinity of 2.0 because light absorption is small and low reflection characteristic is demonstrated.

Moreover, as another antireflection film, for example, a silicon oxide film, a titanium dioxide film, a zinc oxide film, a stannum oxide film, or the like, can be used as described above. Among these antireflection films, a thermal silicon oxide film has the smallest interface state density and is suitable for enhancing the solar cell power characteristic. However, a refractive index thereof is approximately 1.5, and therefore, for example, in the case of sealing the solar cell under a glass in the module, it is occasionally difficult to sufficiently reduce reflectance.

Furthermore, with respect to the method for forming an antireflection film, a plasma CVD method, a coating method, a vacuum evaporation method, or the like, can be used as well as the above-described LPCVD method. However, it is preferable that the above-described silicon nitride film is formed by LPCVD method from a view of thermal resistance. Furthermore, if a film having a refractive index between 1 and 2 such as a magnesium difluoride film is further formed on the above-described anti-reflection film so as to be under a condition that the total of the reflectances thereof becomes the smallest, the reflectance is further reduced and generation current density can be enhanced.

(Formation of an Electrode Groove: Step e)

Figure 3:
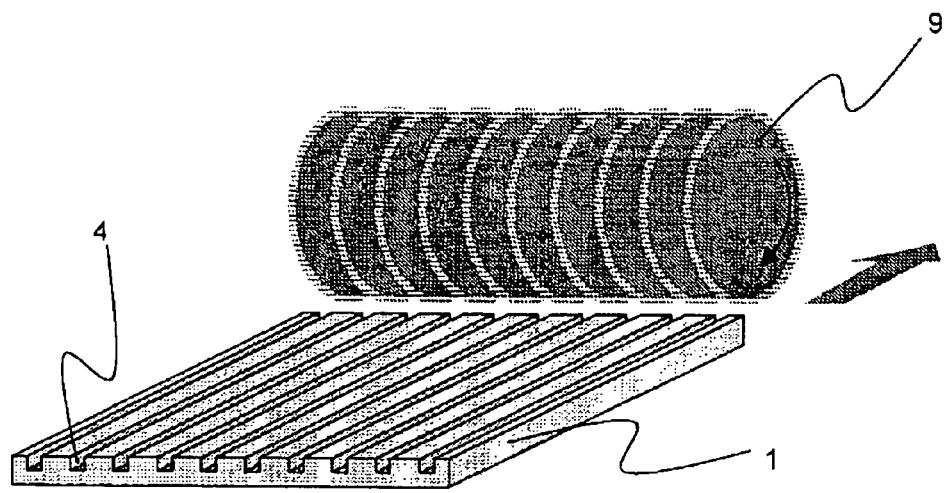
FIG. 3 is a schematic explanation view for explaining a multi-blade dicing saw used in forming an electrode groove.

After forming an antireflection film in the above-described manner, an electrode groove 4 is formed on the substrate front surface side on which the antireflection film is formed in the p-type silicon single crystal substrate 1, for example, by utilizing a multi-blade dicing saw 9 as shown in FIG. 3. In this case, it is important that the groove direction of the electrode groove is not in parallel with a <110> direction for improving yield in the sequential screen printing. It is preferable that the direction is inclined at 45° to a <110> direction. Moreover, with respect to a cross-section shape of the electrode groove, a V-shape is possible. However, a U-shape or a rectangular shape is preferable because the electrode cross-section area can be more expanded. Moreover, for the electrode groove, not only a method of utilizing a mechanical grinding apparatus method as described above but also a laser processing method can be utilized. Also, the electrode groove can be formed by utilizing as a mask the antireflection film formed as described above and making openings partially and then utilizing a wet etching method of performing etching with a nitric-hydrofluoric acid or a high-concentration sodium hydroxide solution or a dry etching method according to a reactive ion etching or the like.

(Formation of a High-Concentration N-Type Impurity Layer and a P-Type Impurity Layer: Step f)

After the formation of the electrode groove, a high-concentration n-type impurity layer is formed around the electrode groove and a p-type impurity layer is formed on the substrate back surface. For example, by performing phosphorus thermal diffusion in the substrate front surface at 870° C. by using a phosphorus oxychloride liquid source, the high-concentration n-type impurity layer having a sheet resistance of approximately 30Ω/□ can be formed inside the groove. Then, by performing thermal diffusion of boron in the back surface of the substrate, the p-type impurity layer can be formed. In forming the impurity layers on the front and back surface of the substrate as described above, for example, in order that phosphorus is prevented from diffusing in the substrate back surface in the formation of the n-type impurity layer and that boron is prevented from diffusing in the substrate front surface in the formation of the p-type impurity layer, it is preferable that each of the thermal diffusions is performed by using such back-to-back diffusion as explained above. Also, as another method, a thermal diffusion method of utilizing a solid diffusion source or an ion implantation method can be utilized. However, for example, a simultaneous diffusion of spin-coating phosphorus dopant and boron dopant respectively on the front surface of the silicon substrate and on the back surface thereof and then stacking a large number of the substrates and performing diffusion at one time is one of simple and economically effective methods.

(Formation of a Front Surface Electrode and a Back Surface Electrode: Step g)

Then, paste made of Al or the like (paste kneaded and dispersed by a three-roll mill after mixing an Al power, a glass frit, an organic vehicles, a solvent, and so forth. There is a case of using a mixture of Ag and Al instead of the Al powder. For the kneading and dispersing, a bead mill, a kneader, or the like, can also be used as well as the three-roll mill) is coated entirely or in a lattice shape on the substrate back surface by a screen printing method, and dried, for example, at 150° C. in a clean oven, and then baked over 10 min in a near-infrared furnace in which the maximum temperature is set to 750° C., and thereby, an Al electrode (back surface electrode) is formed on the substrate back surface.

Furthermore, on the substrate front surface side, a buried electrode (front surface electrode) is formed by a screen printing method by using the above-described electrode material of the present invention (paste kneaded and dispersed by a three-roll mill after mixing an Ag powder, a glass frit an organic vehicle, a solvent, and so forth). For example, the electrode material of the present invention is printed in the electrode groove by printing and plate-making for a comb-shaped electrode pattern by using a screen printing method, and dried at 150° C. in a clean oven, and then baked for approximately 5 min in a near-infrared furnace in which the maximum temperature is set to 700° C., and thereby, a buried electrode can be formed. In addition, in the present invention, a method for forming the buried electrode is not particularly limited. For example, a buried electrode can be formed by a dispenser. However, by using a screen printing method as described above, it becomes possible that a solar cell is produced with high productivity. Therefore, it becomes possible to accomplish cost reduction of the solar cell.

By producing a solar cell as described above, an electrode having narrow line width that is completely filled in the electrode groove can be easily formed. Thereby, for example, as shown in FIG. 1, a high-quality solar cell that no breaking and no delamination are generated and generation of blur or patchiness is prevented in and that a high power can be obtained by can be stably produced.

Hereinafter, the present invention will be explained more specifically with reference to Examples and Comparative examples. However, the present invention is not limited thereto.

Examples 1-11 and Comparative Examples 1-7

Hereinafter, by using 18 kinds of electrode materials as shown in Table 1, productions of solar cells were performed as follows according to the flow chart shown in FIG. 2.

In addition, the electrode materials comprised content rates of an Ag powder as described in the Table, a 2-wt % glass frit, and remaining amount of an organic vehicle. Moreover, as shown in Table 1, TI value in 5 rpm/50 rpm cannot be measured when the viscosity of the material is over 200 Pa·s. Therefore, with respect to the electrode materials of Examples 6-9, 11 and Comparative examples 3, 4, the TI values were incapable measurement (immeasurable).

(Preparation of a Silicon Substrate: Step a)

By using CZ method, a plurality of boron-doped p-type silicon single crystal substrates having a crystal plane orientation of (100) and 10-cm square and a 250-μm thickness and an as-sliced specific resistance of 2 Ω·cm (a dopant concentration of $7.2 \times 10^{15}$ cm$^{-3}$) were prepared, and immersed in a 40-wt % sodium hydroxide aqueous solution, and thereby, damaged layers generated on the substrates were removed by etching. In addition, in Examples, a sodium hydroxide aqueous solution was used in removing damage of the substrate. However, it is possible to use a strong alkali aqueous solution such as potassium hydroxide, and also, by an acidic aqueous solution such as nitric-hydrofluoric acid, the same object can be accomplished.

(Formation of an Uneven Shape on the Substrate Front Surfaces: Step b)

A wet etching was performed by immersing the prepared silicon single crystal substrates in an aqueous solution of 3-wt % sodium hydroxide in which isopropyl alcohol is added, and thereby, random texture surfaces were formed on both sides of the substrates.

(Formation of a Low-Concentration N-Type Impurity Layer: Step c)

By subjecting the silicon single crystal substrates to thermal diffusion at 820° C. by using an oxyphosphorus chloride liquid source, a n-type impurity layer of a sheet resistance of approximately 100Ω/□ was formed on a front surface of each of the substrates. In this case, the back-to-back diffusion was used so that phosphorus did not diffuse in the back surface as mush as possible.

(Formation of an Antireflection Film: Step d)

By using a LPCVD apparatus, each of the silicon single crystal substrates was heated at 800° C. in a monosilane gas and a nitrogen gas atmosphere under a reduced pressure, and thereby, an antireflection film made of a silicon nitride film was formed at a film thickness of 80 nm on the surface on which the n-type impurity layer had been formed.

(Formation of an Electrode Groove: Step e)

By using a multi-blade dicing saw as shown in FIG. 3, electrode grooves having a pitch of 2.5 mm and a width of 60 μm and a depth of 50 μm were formed on the front surface of each of the silicon single crystal substrates. In this case, the groove direction of each of the electrode grooves was inclined at 45° to a crystal orientation of <110>.

(Formation of a High-Concentration N-Type Impurity Layer and a P-Type Impurity Layer: Step f)

Phosphorus dopant was spin-coated on the front surface side of each of the silicon substrates and boron dopant was spin-coated on the back surface side thereof, and then, the substrate was subjected to heat treatment. A high-concentration n-type impurity layer was formed around the electrode groove and p-type impurity layer was formed on the back surface of the substrate.

(Formation of a Front Surface Electrode and a Back Surface Electrode: Step g)

After the phosphorus dopant and the boron dopant formed on the front surface and the back surface of the substrate were etched with hydrofluoric acid and removed, paste made of Al was coated entirely on the substrate back surface by a screen printing method, and dried at 150° C. in a clean oven. Then, by baking it over 10 min in a near-infrared furnace in which the maximum temperature is set to 750° C., an Al electrode (back surface electrode) was formed on the back surface of the substrate. Furthermore, also on the substrate front surface, an electrode material shown in the following Table 1 were printed by a screen printing method, and dried at 150° C. in a clean oven, and then baked for approximately 5 min in a near-infrared furnace in which the maximum temperature is set to 700° C., and thereby, buried electrodes (front surface electrodes) were formed in the electrode grooves.

TABLE 1

| Electrode Material | Ag Content rate (wt %) | Blend Ratio of an Ag Powder (wt percentage) | | | | | | Viscosity (Pa·s) at 25° C. | TI Value 5 rpm/ 20 rpm at 25° C. | 5 rpm/ 50 rpm at 25° C. |
|---|---|---|---|---|---|---|---|---|---|---|
| | | 0.5-3 μm Ag grains | | | 4-8 μm Ag grains | | | | | |
| | | 0.5 μm | 1.5 μm | 3 μm | 4 μm | 6 μm | 8 μm | | | |
| Example 1 | 85 | 20 | | | | | 80 | 200 | 1.5 | 2.0 |
| Example 2 | 85 | | 20 | | | | 80 | 170 | 1.2 | 1.6 |
| Example 3 | 85 | | | 20 | | | 80 | 150 | 0.9 | 1.2 |
| Example 4 | 85 | | 20 | | 80 | | | 200 | 1.2 | 1.5 |
| Example 5 | 85 | | 20 | | | | 80 | 180 | 0.9 | 1.2 |
| Example 6 | 85 | | 30 | | | 70 | | 210 | 1.1 | Immeasurable |
| Example 7 | 85 | | 50 | | | 50 | | 250 | 1.3 | Immeasurable |
| Example 8 | 85 | | 70 | | | 30 | | 280 | 1.5 | Immeasurable |
| Example 9 | 85 | | 80 | | | 20 | | 300 | 1.7 | Immeasurable |
| Example 10 | 75 | | | 20 | | | 80 | 150 | 0.5 | 0.7 |
| Example 11 | 95 | 80 | | | 20 | | | 400 | 1.9 | Immeasurable |
| Comparative example 1 | 85 | | 10 | | | | 90 | 30 | 0.3 | 0.4 |
| Comparative example 2 | 85 | 10 | | | 90 | | | 80 | 0.5 | 0.9 |
| Comparative example 3 | 85 | 90 | | | 10 | | | 480 | 2.5 | Immeasurable |
| Comparative example 4 | 85 | | 90 | | 10 | | | 350 | 2.2 | Immeasurable |
| Comparative example 5 | 75 | 90 | | | 10 | | | 130 | 1.2 | 0.9 |
| Comparative example 6 | 95 | | 10 | | | | 90 | 120 | 0.4 | 0.7 |
| Comparative example 7 | 70 | 80 | | | 20 | | | 80 | 0.4 | 0.5 |

With respect to the 10-cm-square solar cells of the prepared Examples 1-11 and Comparative examples 1-7, current and voltage characteristics were measured in an atmosphere at 25° C. under a solar simulator (light intensity: 1 kW/m$^2$, spectrum: AM 1.5 global) and appearance inspection of finger electrodes thereof was performed. In the following Table 2, typical solar cell characteristics of the prepared solar cells in this time are shown. Furthermore, in Table 3, the result of performing the appearance inspection and cross-section observation, and in FIG. 4(A)-(D), states of front surface electrodes buried in the electrode grooves are shown.

TABLE 2

| Electrode Material | Open Circuit Voltage (mV) | Short Circuit Current Density (mA/cm$^2$) | Conversion Efficiency (%) | Fill Factor |
|---|---|---|---|---|
| Example 1 | 631 | 35.9 | 17.9 | 0.791 |
| Example 2 | 630 | 35.5 | 17.6 | 0.785 |
| Example 3 | 629 | 35.4 | 17.4 | 0.781 |
| Example 4 | 631 | 35.6 | 17.7 | 0.786 |
| Example 5 | 629 | 35.7 | 17.6 | 0.782 |
| Example 6 | 630 | 36.1 | 17.9 | 0.788 |
| Example 7 | 628 | 34.7 | 17.0 | 0.778 |
| Example 8 | 629 | 36.0 | 17.3 | 0.765 |
| Example 9 | 632 | 36.2 | 18.0 | 0.787 |
| Example 10 | 630 | 35.8 | 17.4 | 0.770 |
| Example 11 | 628 | 36.0 | 17.4 | 0.771 |
| Comparative example 1 | 623 | 33.0 | 15.4 | 0.750 |
| Comparative example 2 | 625 | 32.8 | 15.3 | 0.745 |
| Comparative example 3 | 628 | 35.5 | 15.7 | 0.705 |
| Comparative example 4 | 631 | 35.7 | 15.7 | 0.699 |
| Comparative example 5 | 629 | 35.5 | 15.9 | 0.710 |
| Comparative example 6 | 623 | 33.2 | 15.5 | 0.751 |
| Comparative example 7 | 628 | 35.3 | 15.7 | 0.707 |

TABLE 3

Figure 4:
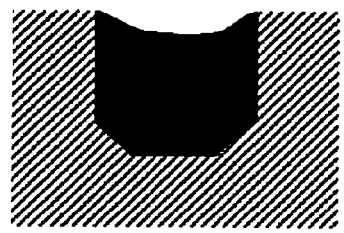
FIG. 4 is a cross-section view showing cross sections of the electrode in solar cells of Examples and Comparative examples.
Figure 4:
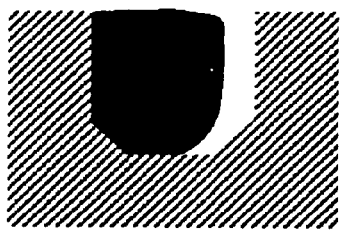
Figure 4:
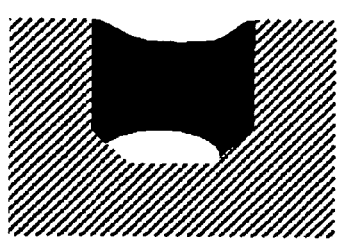
Figure 4:
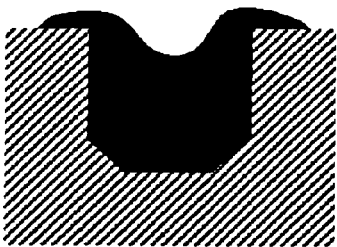

| Electrode Material | Gap, Delamination | Resistivity | Blur | Patchiness | Cross-Section Shape |
|---|---|---|---|---|---|
| Example 1 | — | — | — | — | FIG. 4 (A) |
| Example 2 | — | — | — | — | FIG. 4 (A) |
| Example 3 | — | — | — | — | FIG. 4 (A) |
| Example 4 | — | — | — | — | FIG. 4 (A) |
| Example 5 | — | — | — | — | FIG. 4 (A) |
| Example 6 | — | — | — | — | FIG. 4 (A) |
| Example 7 | — | — | Partially Generated | — | FIG. 4 (A) and (D) |
| Example 8 | — | — | — | Partially Generated | FIG. 4 (A) and (C) |
| Example 9 | — | — | — | Partially Generated | FIG. 4 (A) and (C) |
| Example 10 | — | — | — | — | FIG. 4 (A) |
| Example 11 | — | — | — | Partially Generated | FIG. 4 (A) and (C) |
| Comparative example 1 | — | Increase | Generated | — | FIG. 4 (D) |
| Comparative example 2 | — | Increase | Generated | — | FIG. 4 (D) |
| Comparative example 3 | — | — | — | Generated | FIG. 4 (C) and Shape near to FIG. 4 (A) |
| Comparative example 4 | — | — | — | Generated | FIG. 4 (C) |
| Comparative example 5 | Generation of Gap and Delamination | — | — | — | FIG. 4 (B) |
| Comparative example 6 | — | Increase | Generated | — | FIG. 4 (D) |
| Comparative example 7 | Generation of Gap | — | — | — | FIG. 4 (B) |

As shown in the above-described Table 3, it was confirmed that any one of the solar cells of Examples 1-11 did not generate delamination or breaking and that its electrode had a sufficient contact area with the substrate and was stably formed in the electrode grove. Moreover, in Examples 7-9 and 11, blur or patchiness was observed in a part of the electrode. However, the generation part was extremely small. Therefore, it was also found that generation of blur or patchiness was prevented.

On the other hand, in the solar cells of Comparative examples 1, 2, and 6, the resistivity of the electrode material was increased, and blur as shown in FIG. 4(D) was significantly observed. Moreover, in the solar cells of Comparative examples 3, 4, patchiness as shown in FIG. 4(c) was significantly observed. Furthermore, in the solar cells of Comparative examples 5, 7, delamination or gap was generated in the electrode formation by generation of constriction or the like of the electrode material, and thereby, the contact area between the substrate and the electrode was drastically degraded.

Furthermore, as shown in Table 2, in any one of the solar cells of Examples 1-11, conversion efficiency was high, 17% or more, and fill factor was more excellent than that of Comparative examples. Therefore, it was found that the solar cell had very high performance. On the other hand, in any one of the solar cells of Comparative examples 1-7, conversion efficiency indicates a low value, less than 16%, and it was found that in the solar cells of Comparative examples 3-5, 7, fill factors were largely degraded.

The present invention is not limited to the above-described embodiments. The above-described embodiments are mere examples, and those having the substantially same constitution as that described in the appended claims and providing the similar action and advantages are included in the scope of the present invention.

For example, in the above description, the case of producing a solar cell is mainly explained. However, the electrode material of the present invention is not limited thereto, and can also be applied similarly to a semiconductor device having an electrode except a solar cell.

The invention claimed is:

1. An electrode material comprising at least, a silver powder, a glass frit, and an organic vehicle, wherein Ag content of the electrode material is 75 wt % to 95 wt %, and wherein a ratio of contents of Ag grains having an average grain diameter of 0.5 μm to 3 μm and Ag grains having an average grain diameter of 4 μm to 8 μm in the electrode material is (the Ag grains having an average grain diameter of 0.5 μm to 3 μm): (the Ag grains having an average grain diameter of 4 μm to 8 μm)=20-80 wt %:80-20 wt %, wherein substantially all Ag grains in the silver powder have a diameter in a range of 0.5 μm to 3 μm or in a range of 4 μm to 8 μm.

2. The electrode material according to claim 1, wherein a viscosity of the electrode material is 150 Pa·s to 400 Pa·s.

3. The electrode material according to claim 1, wherein a thixotropy (TI value) in 5 rpm/50 rpm of the electrode material is 0.5 to 2.5, or a thixotropy (TI value) in 5 rpm/20 rpm thereof is 0.5 to 2.0.

4. The electrode material according to claim 2, wherein a thixotropy (TI value) in 5 rpm/50 rpm of the electrode material is 0.5 to 2.5, or a thixotropy (TI value) in 5 rpm/20 rpm thereof is 0.5 to 2.0.

5. The electrode material according to claim 1, wherein a decomposition initiation temperature of the organic vehicle is 170° C. to 250° C.

6. The electrode material according to claim 2, wherein a decomposition initiation temperature of the organic vehicle is 170° C. to 250° C.

7. The electrode material according to claim 3, wherein a decomposition initiation temperature of the organic vehicle is 170° C. to 250° C.

8. The electrode material according to claim 4, wherein a decomposition initiation temperature of the organic vehicle is 170° C. to 250° C.

9. A method for producing a solar cell, comprising, at least, a step of forming an impurity layer having a second conductivity type different from a first conductivity type on a front surface of a silicon substrate having the first conductivity type, a step of forming an antireflection film on the impurity layer having the second conductivity type, a step of forming an electrode groove on the silicon substrate, and a step of forming an electrode in the electrode groove formed on the silicon substrate by using the electrode material according to claim 1.

10. The method for producing a solar cell according to claim 9, wherein the step of forming an electrode is performed by a screen printing method.

* * * * *